(12) United States Patent
Motomura et al.

(10) Patent No.: US 11,282,733 B2
(45) Date of Patent: Mar. 22, 2022

(54) STAGE MECHANISM, PROCESSING APPARATUS, AND METHOD OF OPERATING THE STAGE MECHANISM

(71) Applicant: TOKYO ELECTRON LIMITED, Tokyo (JP)

(72) Inventors: Yuuki Motomura, Nirasaki (JP); Hiroshi Sone, Tokyo (JP); Yasuyuki Kagaya, Nirasaki (JP); Naoyuki Suzuki, Tokyo (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 301 days.

(21) Appl. No.: 16/521,042

(22) Filed: Jul. 24, 2019

(65) Prior Publication Data

US 2020/0035537 A1 Jan. 30, 2020

(30) Foreign Application Priority Data

Jul. 30, 2018 (JP) .............................. JP2018-142579

(51) Int. Cl.
*H01L 21/683* (2006.01)
*C23C 14/50* (2006.01)
*H01L 21/687* (2006.01)

(52) U.S. Cl.
CPC .......... *H01L 21/6833* (2013.01); *C23C 14/50* (2013.01); *H01L 21/68742* (2013.01); *H01L 21/68757* (2013.01); *H01L 21/68764* (2013.01)

(58) Field of Classification Search
CPC ........... H01L 21/6833; H01L 21/68764; H01L 21/68757; H01L 21/68742; H01L 21/68785; H01L 21/67103; H01L 21/6831; H01L 21/673; C23C 14/50; C23C 14/225; C23C 14/3464; C23C 14/505

See application file for complete search history.

(56) References Cited

U.S. PATENT DOCUMENTS 5,815,366 A * 9/1998 Morita ................ H01L 21/6833
361/234
9,595,464 B2 3/2017 Thirunavukarasu et al.

FOREIGN PATENT DOCUMENTS

| JP | 5323317 B2 | 7/2013 |
| KR | 10-2004-0002552 B1 | 1/2004 |
| KR | 10-2017-0129940 A | 11/2017 |

* cited by examiner

*Primary Examiner* — Dharti H Patel
(74) *Attorney, Agent, or Firm* — Nath, Goldberg & Meyer; Jerald L. Meyer; Tanya E. Harkins

(57) ABSTRACT

There is provided a stage mechanism, including: an electrostatic chuck having a conductive film formed on a front surface thereof, the conductive film configured to make electrically contact with a rear surface of a substrate; a conductive member electrically connected to the conductive film and formed to extend to a rear surface of the electrostatic chuck; and a moving member electrically connected to the conductive member via a connecting member and configured to move between a first position connected to a ground potential and a second position not connected to the ground potential.

11 Claims, 9 Drawing Sheets

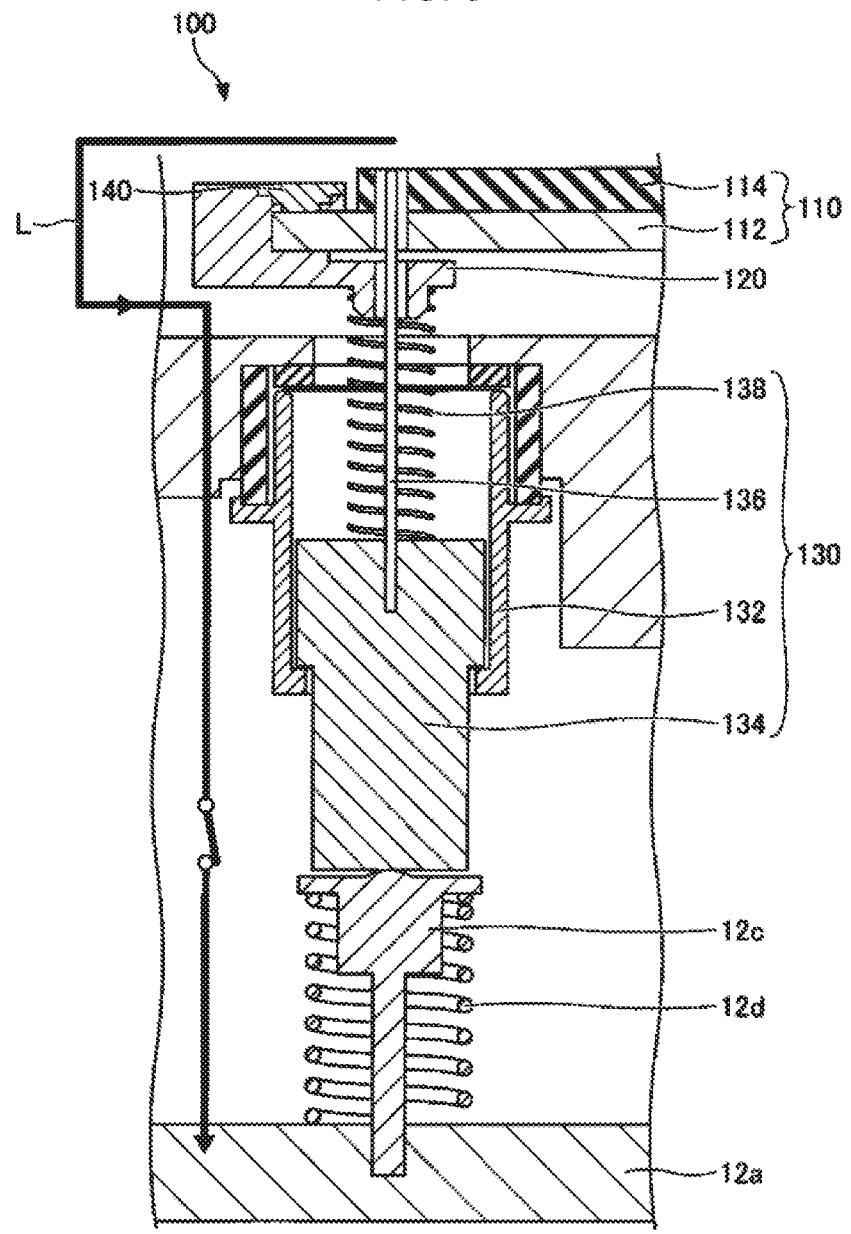

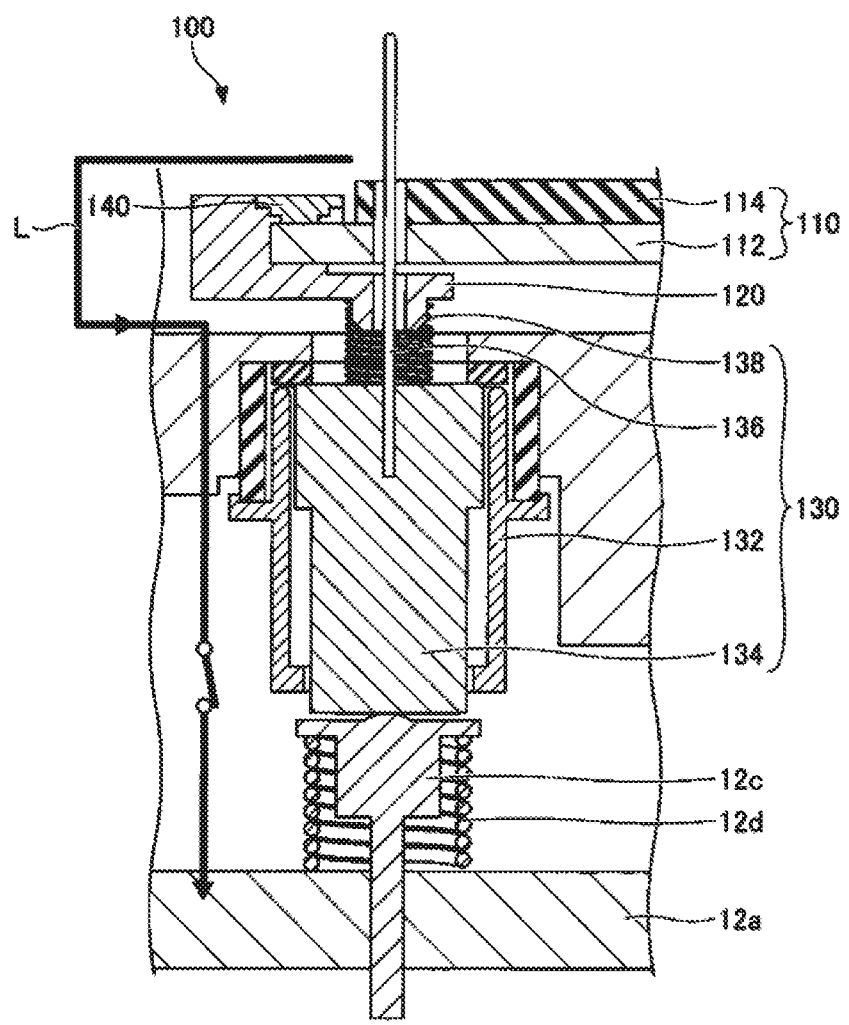

STAGE MECHANISM, PROCESSING APPARATUS, AND METHOD OF OPERATING THE STAGE MECHANISM

CROSS-REFERENCE TO RELATED APPLICATION

This application is based upon and claims the benefit of priority from Japanese Patent Application No. 2018-142579, filed on Jul. 30, 2018, the entire contents of which are incorporated herein by reference.

TECHNICAL FIELD

The present disclosure relates to a stage mechanism, a processing apparatus, and a method of operating the stage mechanism.

BACKGROUND

When a substrate adsorbed onto an adsorption surface of an electrostatic chuck is separated from the electrostatic chuck and if elevating pins are raised in a state where an electrostatic force caused by residual charges accumulated in the electrostatic chuck or the substrate remains, the substrate may be deviated or damaged. Thus, it is well known that techniques exist for eliminating the residual charges accumulated in the electrostatic chuck or the substrate (for example, see Patent Documents 1 and 2).

RELATED ART DOCUMENT

Patent Documents

[Patent Document 1] Japanese Patent Laid-Open Publication No. JP 5323317

[Patent Document 2] U.S. Pat. No. 9,595,464

SUMMARY

Some embodiments of the present disclosure provide a technique capable of effectively suppressing a deviation or damage of a substrate, which is caused by residual charges, compared to a conventional technique.

According to an embodiment of the present disclosure, there is provided a stage mechanism, including: an electrostatic chuck having a conductive film formed on a front surface thereof, the conductive film configured to make electrically contact with a rear surface of a substrate; a conductive member electrically connected to the conductive film and formed to extend to a rear surface of the electrostatic chuck; and a moving member electrically connected to the conductive member via a connecting member and configured to move between a first position connected to a ground potential and a second position not connected to the ground potential.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 9 is an explanatory view of an operation of the stage mechanism.

FIG. 10 is an explanatory view of an operation of the stage mechanism.

DETAILED DESCRIPTION

Figure 1:
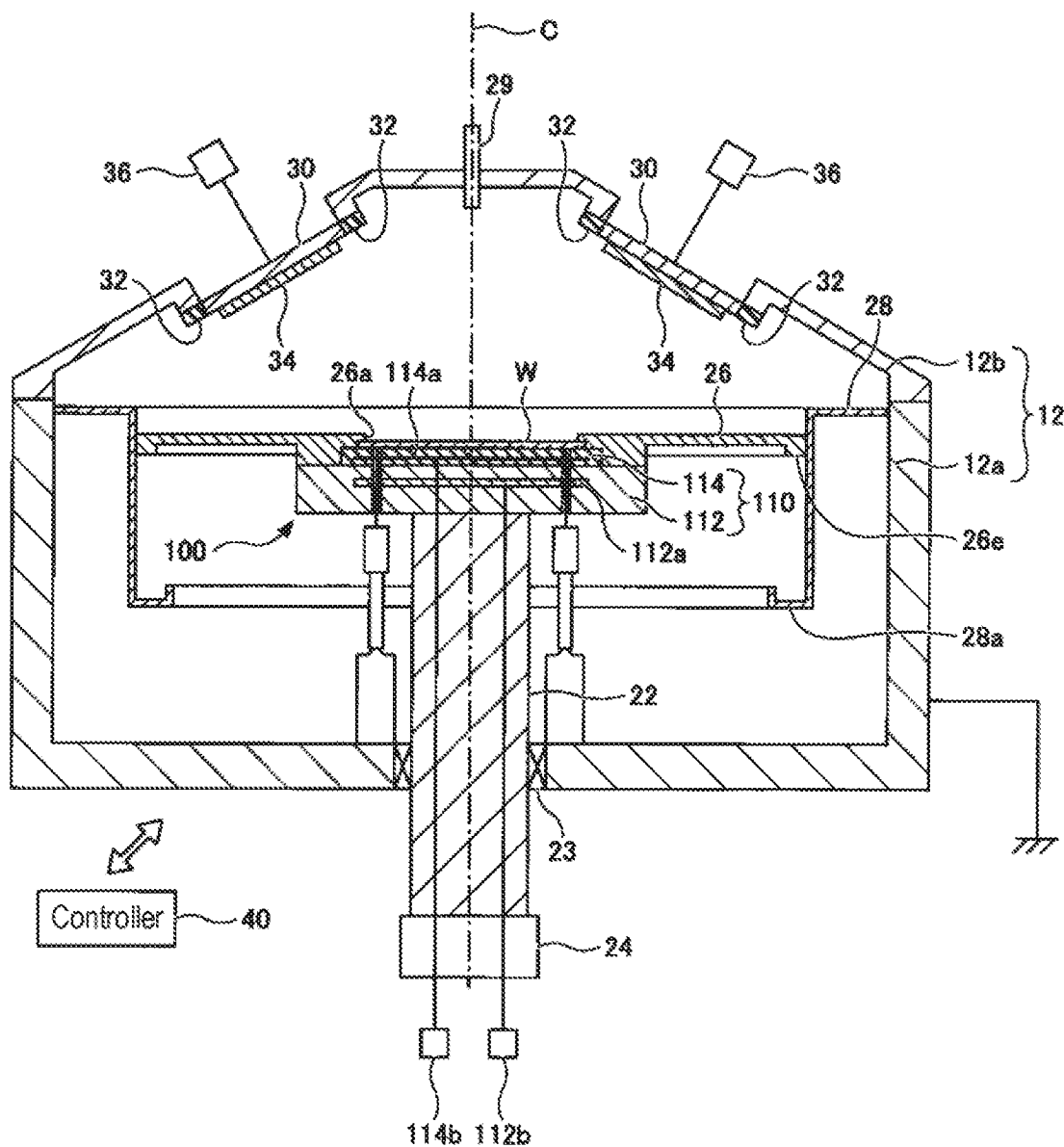
FIG. 1 is a cross-sectional view illustrating an exemplary configuration of a processing apparatus.

Hereinafter, non-limitative exemplary embodiments of the present disclosure will now be described with reference to the accompanying drawings. In all the accompanying drawings, the same or corresponding members or components will be denoted by the same or corresponding reference numerals, and redundant explanations thereof will be omitted.

(Processing Apparatus)

A processing apparatus according to an embodiment of the present disclosure will be described by using a sputtering apparatus which radiates a semiconductor wafer (hereinafter, referred to as a "wafer") as an example of a substrate with sputtered particles from a target material arranged obliquely with respect to a front surface of the wafer, thus forming a film on the wafer. FIG. 1 is a cross-sectional view illustrating an exemplary configuration of the processing apparatus.

As illustrated in FIG. 1, a processing apparatus 10 includes a process vessel 12. The process vessel 12 includes a main body 12a and a lid 12b. The main body 12a has a substantially cylindrical shape with its upper end opened. The main body 12a is grounded. A central axis line of the main body 12a coincides with an axis line C. The lid 12b is installed on the main body 12a. An upper end opening of the main body 12a is closed by the lid 12b, a holder 30, and a holder supporting part 32. The holder 30 and the holder supporting part 32 will be described later.

A stage mechanism 100 is installed inside the process vessel 12. The stage mechanism 100 includes a stage 110. Details of the stage mechanism 100 will be described later.

A shaft body 22 is coupled to the stage 110. The shaft body 22 extends downward from the stage 110. The shaft body 22 passes through the bottom of the main body 12a so as to extend outward of the process vessel 12. A seal mechanism 23 for airtightly sealing the interior of the process vessel 12 is installed between the shaft body 22 and the bottom of the main body 12a. A central axis line of the shaft body 22 substantially coincides with the axis line C.

The shaft body 22 is connected to a driving device 24 provided outside the process vessel 12. The driving device 24 rotates the shaft body 22 about the central axis line of the shaft body 22 as a rotation axis, and moves the shaft body 22 up and down. When mounting the wafer W on the stage 110, the driving device 24 arranges the stage 110 at a relatively lower position inside the process vessel 12. Then, the wafer W transferred into the process vessel 12 by a transfer device (not shown) is adsorbed onto the stage 110 by an electrostatic chuck 114. Thereafter, the driving device 24 moves the stage 110 upward for formation of a film on the wafer W. During the upward movement of the stage 110, a mask 26 is arranged on the stage 110. The mask 26 is a plate-like body having a substantially annular shape. The mask 26 has an opening 26a with a diameter slightly smaller than that of the wafer W. An outer edge 26e of the mask 26 protrudes downward.

A mask supporting body 28 is installed inside the process vessel 12. The mask supporting body 28 is suspended downward from the process vessel 12. The mask supporting body 28 is opened in a region (a region along the axis line C) in which the stage 110 moves so as not to hinder the vertical movement of the stage 110. The mask supporting body 28 has a supporting portion 28a. The supporting portion 28a is opened upward and has a recess formed to extend in the circumferential direction with respect to the axis line C. The outer edge 26e of the mask 26 is arranged in the recess formed by the supporting portion 28a. Therefore, the mask 26 is supported by the mask supporting body 28 when it is separated from the stage 110.

The processing apparatus 10 includes a gas supply part 29. The gas supply part 29 supplies a gas into the process vessel 12. In addition, the processing apparatus 10 includes the holder 30 and the holder supporting part 32. The holder supporting part 32 is an insulator and is installed in the lid 12b. The holder supporting part 32 supports the holder 30 and electrically insulates the holder 30 from the lid 12b. The holder 30 holds the target material 34. A power source 36 is connected to the holder 30. When a voltage is applied to the holder 30 by the power source 36, an electric field is generated around the target material 34. Therefore, the gas supplied from the gas supply part 29 is dissociated to generate ions. The generated ions collide with the target material 34 so that a substance is released from the target material 34. The released substance is deposited on the wafer W.

The processing apparatus 10 includes a controller 40 such as a computer or the like for controlling an overall operation of the processing apparatus 10. The controller 40 controls operations of the respective parts of the processing apparatus 10.

A storage part in which a control program for causing the controller 40 to realize various types of processes executed by the processing apparatus 10 or various programs for causing each part of the processing apparatus 10 to execute the processes according to processing conditions are stored is connected to the controller 40. Various programs may be stored in a storage medium and stored in the storage part. The storage medium may be a hard disk or a semiconductor memory, or may be a portable one such as a CD-ROM, a DVD, a flash memory or the like. Also, the programs may be appropriately transmitted from another device or a host computer to the storage part by a communication means based on, for example, a wired or wireless manner.

In the processing apparatus 10 described above, first, the stage 110 is disposed at a position below the position during the film formation by the driving device 24. Subsequently, the wafer W is mounted on the stage 110 by the transfer device (not shown) and is adsorbed onto the electrostatic chuck 114. Subsequently, the stage 110 is raised by the driving device 24 and the mask 26 is fixed to the stage 110. Subsequently, the stage 110 is further raised by the driving device 24 and moved to the position during the film formation. Subsequently, the stage 110 is rotated by the driving device 24, and a gas is supplied from the gas supply part 29 into the process vessel 12. A voltage is applied from the power source 36 to the holder 30. Thus, the substance released from the target material 34 is deposited on the wafer W to form a desired film.

(Stage Mechanism)

Figure 2:
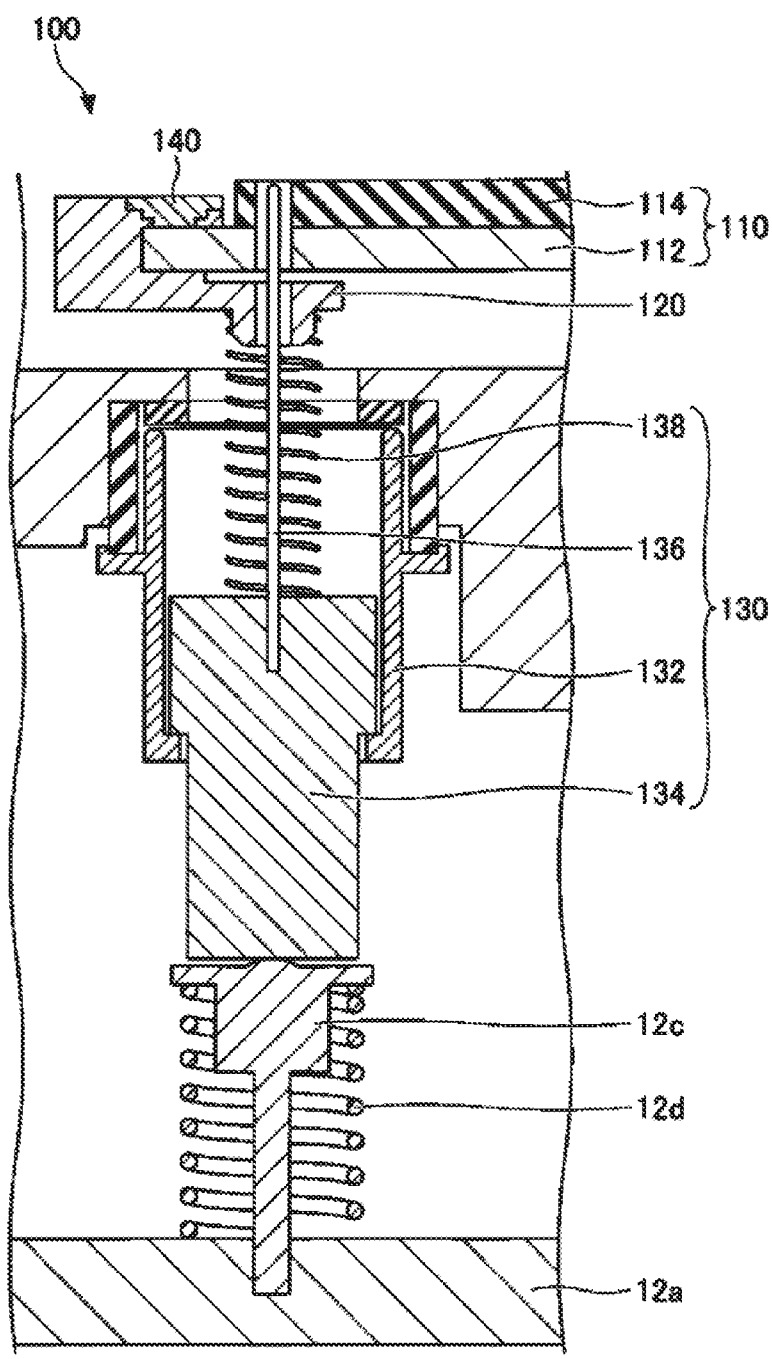
FIG. 2 is a cross-sectional view illustrating an example of a stage mechanism.
Figure 3:
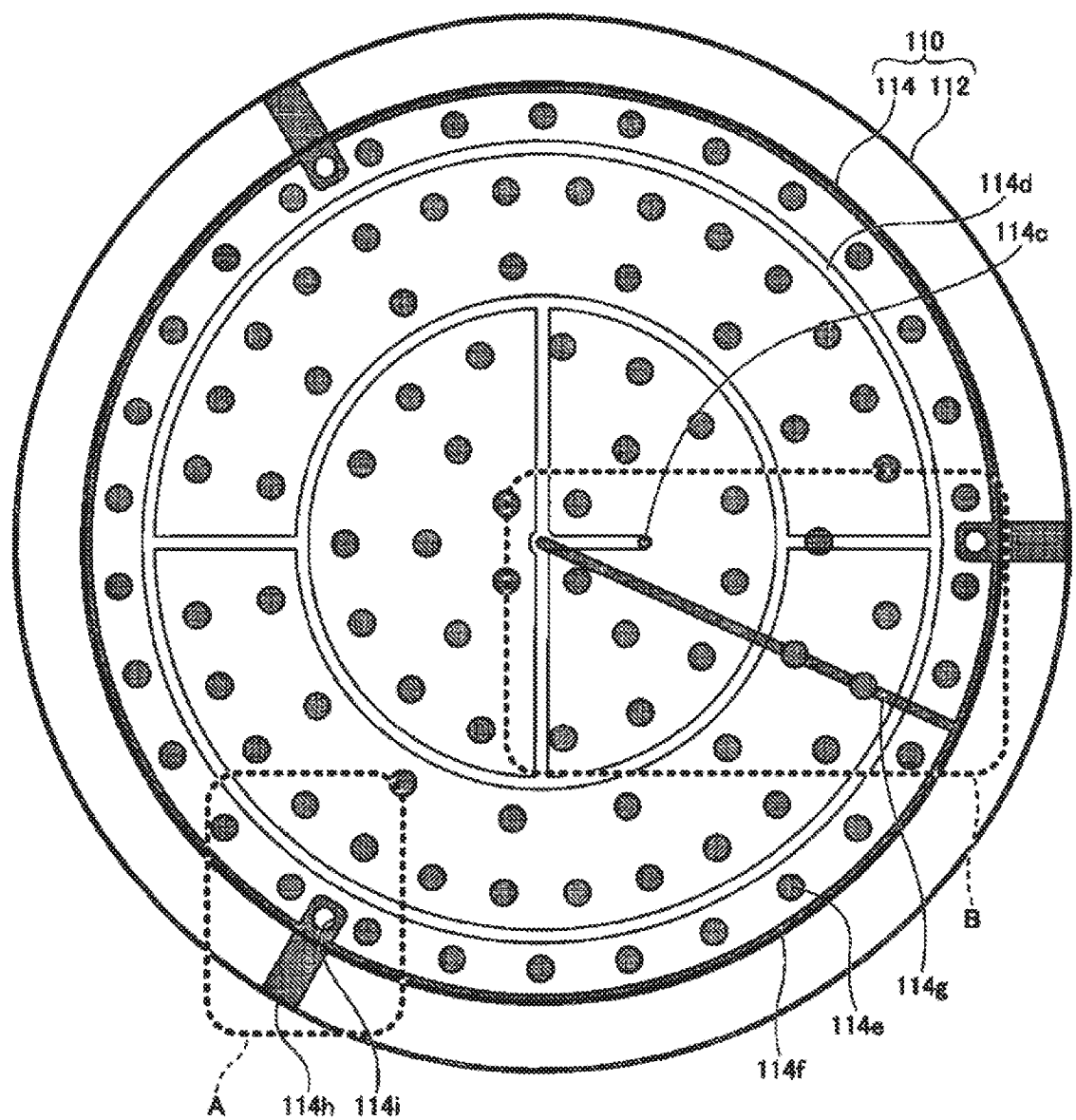
FIG. 3 is a plan view illustrating an example of an electrostatic chuck.
Figure 4:
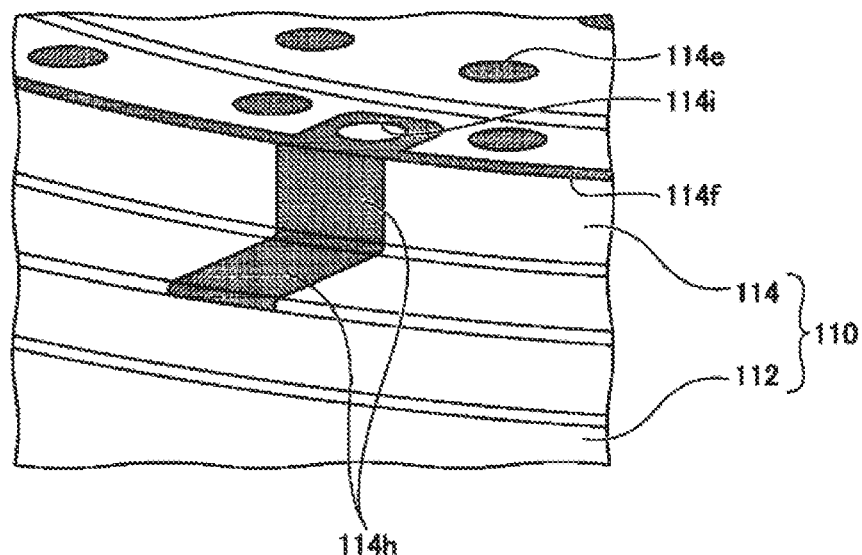
FIG. 4 is an enlarged perspective view of a portion of the electrostatic chuck.
Figure 5:
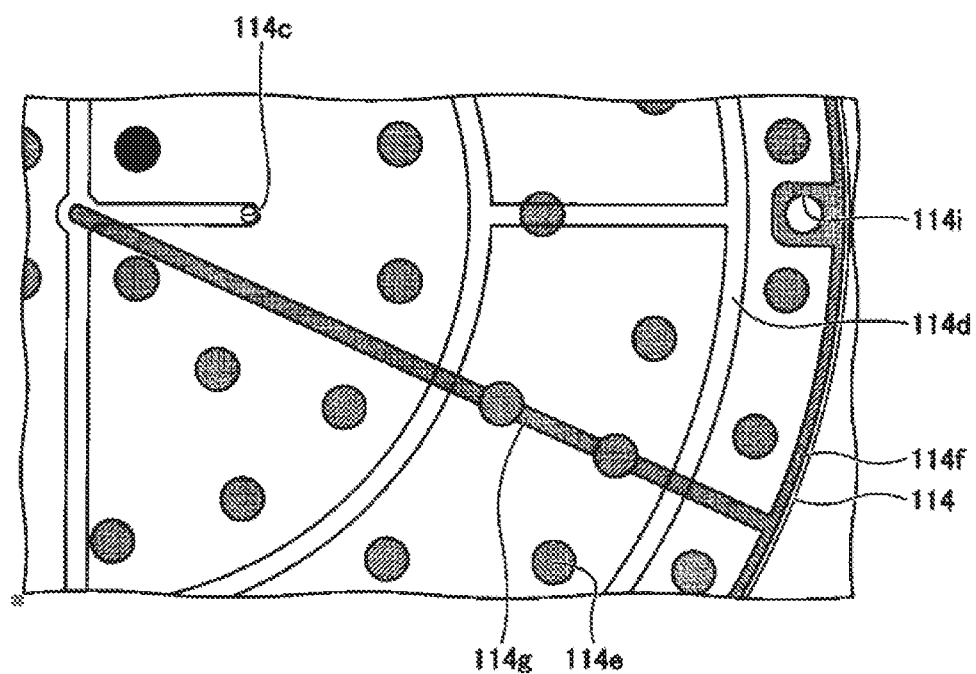
FIG. 5 is an enlarged plan view of a portion of the electrostatic chuck.
Figure 6:
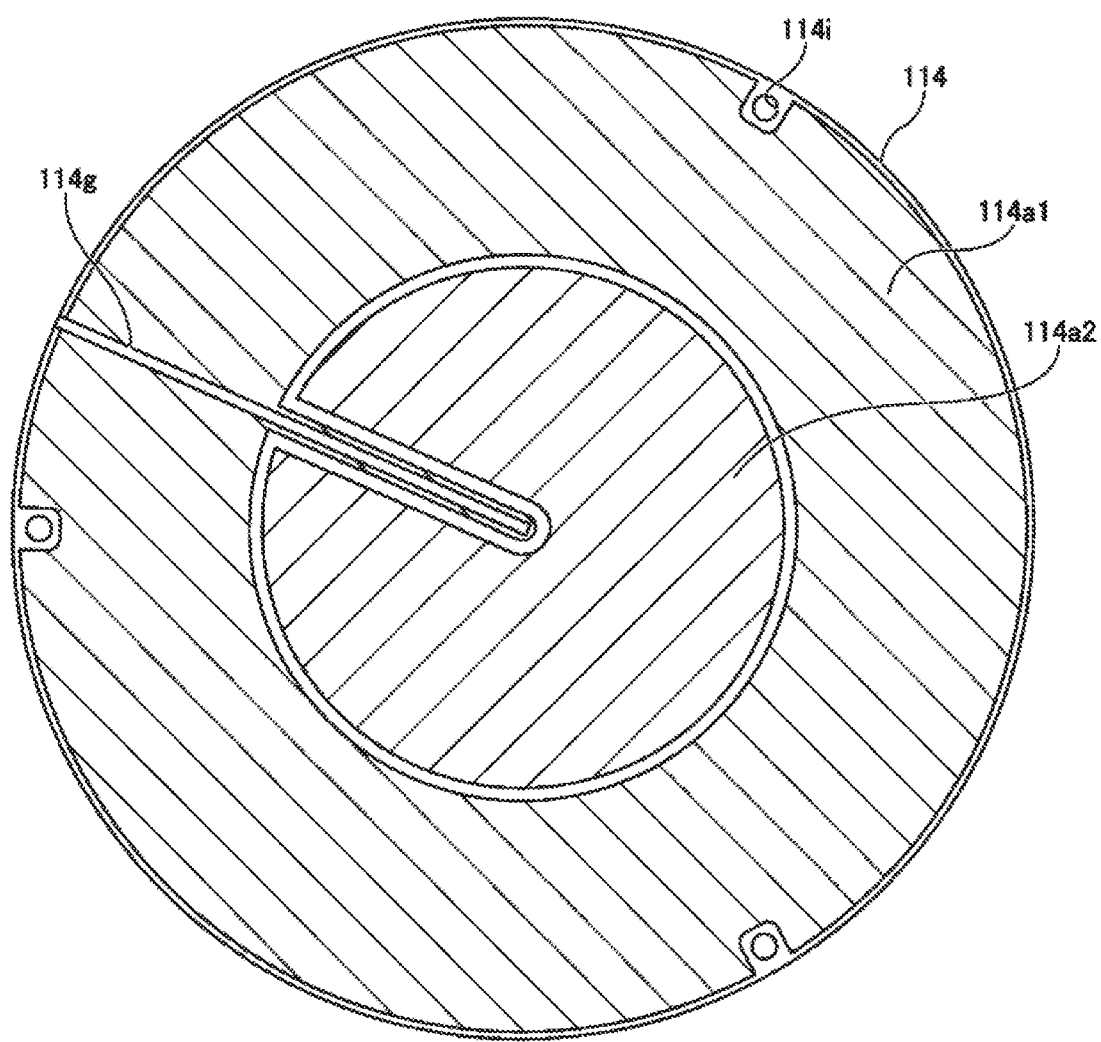
FIG. 6 is an explanatory view of a positional relationship between a conductive film and chuck electrodes formed on a front surface of the electrostatic chuck.

An example of the stage mechanism 100 in the processing apparatus 10 of FIG. 1 will be described. FIG. 2 is a cross-sectional view illustrating an example of the stage mechanism 100, In FIG. 2, an enlarged view of a portion in which one of a plurality of elevating pins is installed is illustrated. This holds true in portions in which the other elevating pins are installed. FIG. 3 is a plan view illustrating an example of the electrostatic chuck 114. FIG. 4 is an enlarged perspective view of a portion of the electrostatic chuck 114, in which an enlarged view of a region A in FIG. 3 is illustrated. FIG. 5 is an enlarged plan view of a portion of the electrostatic chuck 114, in Which an enlarged view of a region B in FIG. 3 is illustrated. FIG. 6 is an explanatory view of the positional relationship between a conductive film and chuck electrodes 114a formed on the front surface of the electrostatic chuck 114.

As illustrated in FIG. 2, the stage mechanism 100 includes the stage 110, a conductive member 120, an elevating pin mechanism 130, and a pressing member 140.

The stage 110 has a base portion 112 and the electrostatic chuck 114.

The base portion 112 has a substantially disc shape. A heater 112a is embedded in the base portion 112. A power source 112b is connected to the heater 112a. The stage 110 can be adjusted to have a predetermined temperature by supplying an electric power from the power source 112b to the heater 112a. Also, the heater 112a may be embedded in the electrostatic chuck 114 or may be a sheet-type heater that is attachable to the stage 110. Furthermore, the heater 112a may be divided into a plurality of zones. When the heater 112a is divided into the plurality of zones, the temperature of the stage 110 can be adjusted for each of the divided zones.

The electrostatic chuck 114 is installed on the base portion 112. The electrostatic chuck 114 has a substantially disc shape with its center substantially positioned on the axis line C. The electrostatic chuck 114 is obtained by sandwiching the chuck electrode 114a formed of a conductive film between a pair of dielectric films. A power source 114b is connected to the chuck electrode 114a. The electrostatic chuck 114 adsorptively holds the wafer W thereon with an electrostatic force caused by the voltage applied from the power source 114b. As illustrated in FIG. 3, a gas hole 114c, a gas groove 114d, pads 114e, a seal band 114f, a dechucking portion 114g, and contact portions 114h are formed on the surface of the electrostatic chuck 114. The pads 114e, the seal band 114f, the dechucking portion 114g, and the contact portions 114h are formed of, for example, a conductive film such as TiN or the like, respectively.

The gas hole 114c is formed in the adsorption surface of the electrostatic chuck 114. The gas hole 114c is connected to an external heat transfer gas supply source. A heat transfer gas such as a helium (He) gas or an argon (Ar) gas is supplied into the gas groove 114d through the gas hole 114c. In one embodiment, one gas hole 114c is formed near the center of the adsorption surface of the electrostatic chuck 114. However, a plurality of gas holes 114c may be formed in the adsorption surface of the electrostatic chuck 114.

The gas groove 114d is formed in the adsorption surface of the electrostatic chuck 114. The gas groove 114d functions as a flow path of the heat transfer gas supplied from the gas hole 114c. In one embodiment, the gas groove 114d is formed over the entire adsorption surface of the electrostatic chuck 114. Therefore, since the heat transfer gas is supplied to the entire adsorption surface of the electrostatic chuck 114, the thermal uniformity of the wafer W adsorbed onto the adsorption surface of the electrostatic chuck 114 is improved.

The pads 114e are formed on the adsorption surface of the electrostatic chuck 114. The pads 114e are formed so as to make contact with the rear surface of the wafer W when the wafer W is adsorbed onto the adsorption surface of the electrostatic chuck 114. The pads 114e cause wafer slipping when the wafer W is adsorbed onto the adsorption surface of the electrostatic chuck 114, to reduce the stress on the wafer W. In one embodiment, a plurality of circular ads 114e are formed over the entire adsorption surface of the electrostatic chuck 114.

The seal band 114f is formed over the entire circumference of the adsorption surface of the electrostatic chuck 114 along the outer periphery thereof. The seal band 114f is formed so as to make contact with the rear surface of the wafer W when the wafer W is adsorbed onto the adsorption surface of the electrostatic chuck 114. The seal band 114f is formed around an insertion hole 114i which is formed in the adsorption surface of the electrostatic chuck 114 and through which an elevating pin 136 is inserted. The seal band 114f is brought into contact with the rear surface of the wafer W when the wafer W is mounted on the adsorption surface of the electrostatic chuck 114. Thus, the heat transfer gas supplied to a space between the rear surface of the wafer W adsorbed onto the adsorption surface of the electrostatic chuck 114 and the adsorption surface of the electrostatic chuck 114 is suppressed from leaking from the space.

The dechucking portion 114g is formed on the adsorption surface of the electrostatic chuck 114 so as to linearly extend from the center of the electrostatic chuck 114 to the outer edge thereof along the radial direction, and is connected to the seal band 114f at the outer edge. The dechucking portion 114g is brought into contact with the rear surface of the wafer W when the wafer W is mounted on the adsorption surface of the electrostatic chuck 114. Thus, the central portion and the outer edge of the electrostatic chuck 114 have the same potential. Furthermore, in a case where the electrostatic chuck 114 is of a hyperbolic type having a pair of chuck electrodes 114a and 114a, as illustrated in FIG. 6, the dechucking portion 114g may be formed at a position which overlaps one chuck electrode 114a1 and does not overlap the other chuck electrode 114a2 in a plan view. Thus, it is possible to suppress the dechucking portion 114g from influencing the electrostatic force of the electrostatic chuck 114.

The contact portions 114h are formed to extend from the seal band 114f formed on the adsorption surface of the electrostatic chuck 114 to the outer edge of the stage 110. The conductive member 120 is electrically connected to the contact portions 114h.

The conductive member 120 is electrically connected to the contact portions 114h formed on the front surface of the stage 110, and formed to extend to the rear surface of the stage 110. The conductive member 120 is made of a conductive material such as aluminum or the like.

The elevating pin mechanism 130 has a housing 132, a shaft 134, the elevating pin 136, and a connecting member 138.

The housing 132 has a cylindrical shape and is fixed to the shaft body 22 through an insulating member such as ceramics or the like. Thus, the housing 132 is moved up and down integrally with the shaft body 22 while electrically floating from the process vessel 12. The housing 132 is made of, for example, stainless steel.

The shaft 134 is an example of a moving member, and is installed so as to be slidably movable with respect to the housing 132 in the vertical direction. The shaft 134 is made of, for example, a conductive material such as stainless steel or the like. The shaft 134 is movable between a position connected to a ground potential and a position not connected to the ground potential. In one embodiment, the position connected to the ground potential is a position electrically connected to the process vessel 12 and is a position making contact with an upper end of a conductive projection 12c installed in the bottom of the process vessel 12. On the other hand, the position not connected to the ground potential is a position electrically insulated from the process vessel 12 and is a position separated from the upper end of the conductive projection 12c installed in the bottom of the process vessel 12. Furthermore, in FIG. 2, a state in which the shaft 134 is in contact with the upper end of the projection 12c is illustrated. The projection 12c may be configured to be movable up and down by elastic deformation of an elastic body 12d (for example, a coil spring) from the viewpoint of lengthening the stroke when the stage 110 is moved down. In this case, since the positional relationship between the stage 110 and the elevating pin 136 is preferably fixed when the connecting member 138 is completely contracted, the resilience force of the elastic body for moving the projection 12c is set larger than that of the connecting member 138.

The elevating pin 136 is installed in the upper end of the shaft 134. Thus, the elevating pin 136 is moved upward and downward integrally with the shaft 134. The elevating pin 136 is formed of a conductive material such as titanium (Ti) or the like. The elevating pin 136 is moved upward integrally with the shaft 134 by pushing out the shaft 134 to the projection 12c. Thus, the elevating pin 136 can be moved upward and downward on the adsorption surface of the electrostatic chuck 114. When the elevating pin 136 is moved upward and is brought into contact with the rear surface of the wafer W at the upper end thereof, the residual charges accumulated in the electrostatic chuck 114 or the wafer W are eliminated through the elevating pin 136, the shaft 134, the projection 12c, and the process vessel 12. In addition, the upper end of the elevating pin 136 is moved to a position higher than the adsorption surface of the electrostatic chuck 114 so that the wafer W is supported by the upper end of the elevating pin 136 and separated from the adsorption surface of the electrostatic chuck 114.

The connecting member 138 is made of a conductive material such as stainless steel or the like. One end of the connecting member 138 is fixed to the upper end of the shaft 134, and the other end thereof is fixed to the conductive member 120. Thus, the shaft 134 and the conductive member 120 are always electrically connected to each other via the connecting member 138 so that they have the same potential. In one embodiment, the connecting member 138 is a coil spring. Thus, even when the relative position between the shaft 134 and the conductive member 120 changes, the state in which the shaft 134 and the conductive member 120 are electrically connected to each other is maintained. The connecting member 138 may be, for example, an electric wire.

The pressing member 140 presses the conductive member 120 against the contact portions 114h formed on the electrostatic chuck 114. Thus, it is possible to absorb a component tolerance and to provide a constant contact force. In one embodiment, the pressing member 140 includes, for example, a spring, and presses the conductive member 120 against the contact portions 114h by virtue of an elastic force of the spring.

(Method of Operating the Stage Mechanism)

A method of operating the stage mechanism 100 of the processing apparatus 10 configured as above will be described by taking, as an example, an operation when the wafer W adsorbed onto the adsorption surface of the electrostatic chuck 114 is lifted up by the elevating pins 136 to be separated from the adsorption surface.

Figure 7:
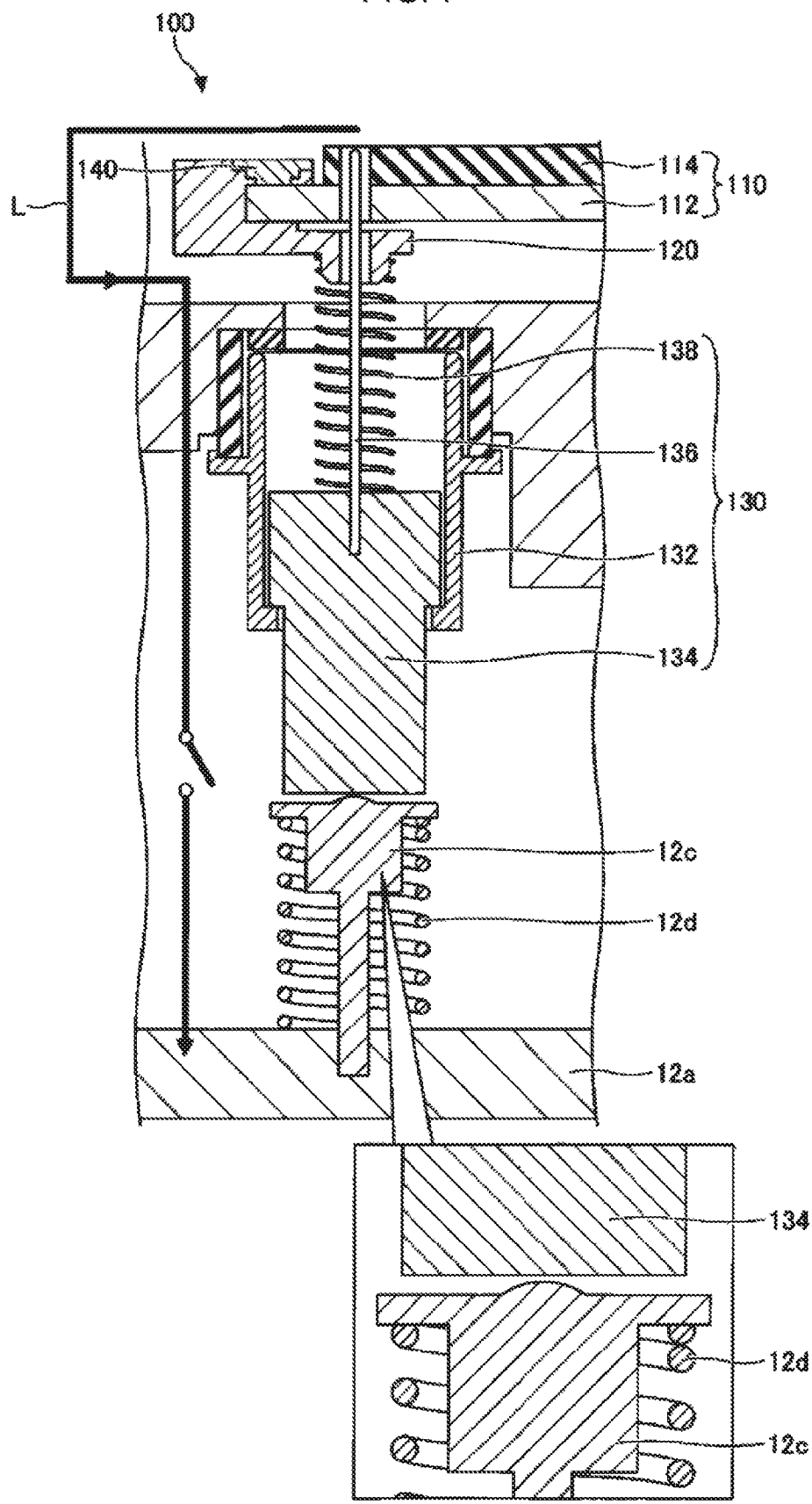
FIG. 7 is an explanatory view of an operation of the stage mechanism.
Figure 8:
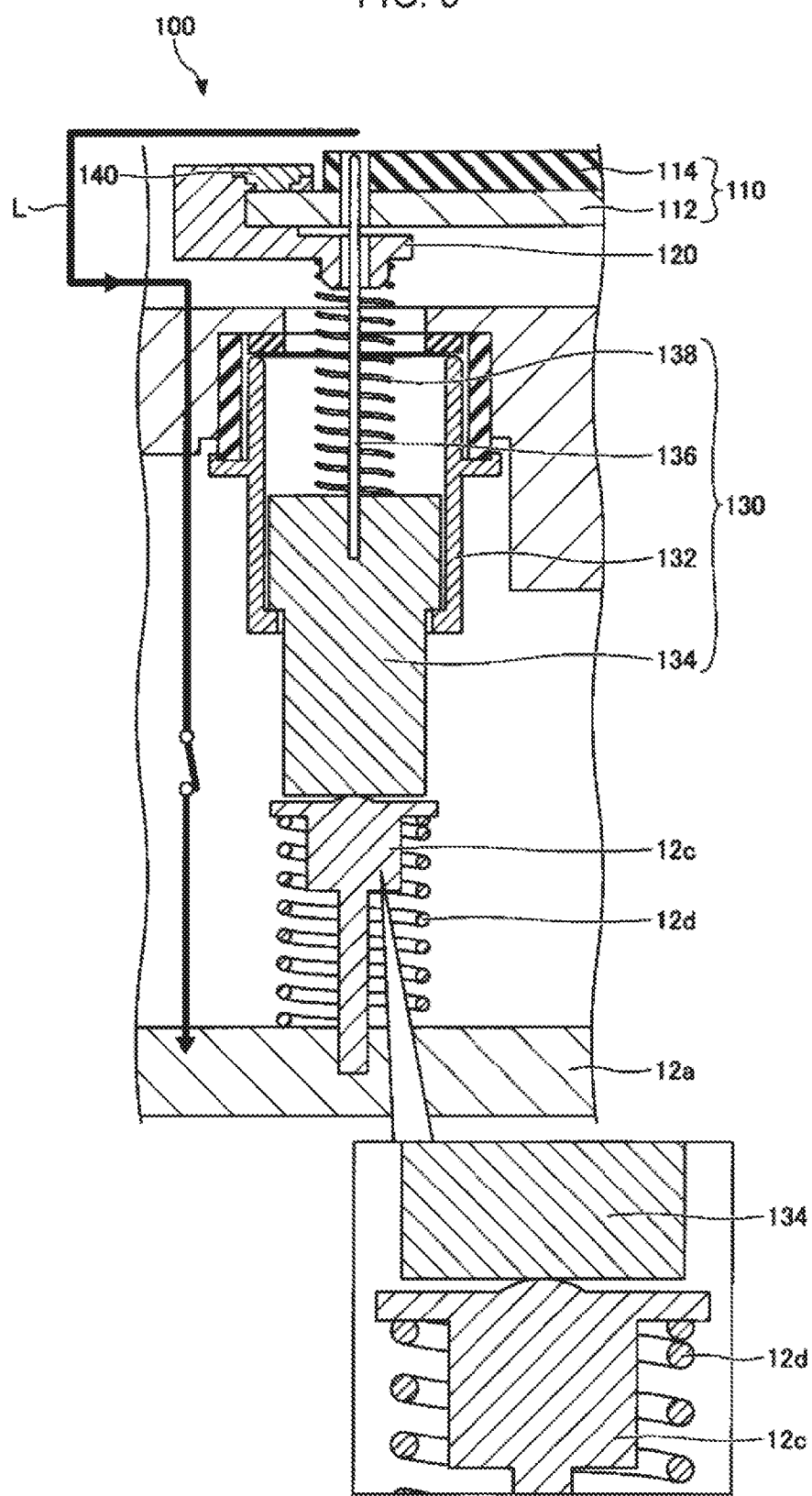
FIG. 8 is an explanatory view of an operation of the stage mechanism.

FIGS. 7 to 10 are views for explaining the operation of the stage mechanism 100. FIG. 7 illustrates a positional relationship between the respective parts of the stage mechanism 100 when the stage 110 is at a position in which the wafer W is adsorbed onto the adsorption surface of the electrostatic chuck 114. FIG. 8 illustrates a positional relationship between the respective parts of the stage mechanism 100 when the stage mechanism 100 is at a position in which the lower end of the shaft 134 and the upper end of the projection 12c are brought into contact with each other. FIG. 9 illustrates a positional relationship between the respective parts of the stage mechanism 100 when the stage mechanism 100 is at a position in which the elevating pin 136 and the rear surface of the wafer W are brought into contact with each other. FIG. 10 illustrates a positional relationship between the respective parts of the stage mechanism 100 when the stage mechanism 100 is at a position in which the wafer W is separated from the adsorption surface of the electrostatic chuck 114 and supported by the elevating pin 136. Furthermore, arrows L in FIGS. 7 to 10 indicate an electrical connection state between the electrostatic chuck 114 and the process vessel 12. In addition, FIGS. 7 to 10 illustrate a state when the stage mechanism 100 is operated without mounting the wafer W on the stage 110.

First, as illustrated in FIG. 7, when the stage 110 is at a position in which the wafer W is adsorbed onto the adsorption surface of the electrostatic chuck 114, the upper end of the elevating pin 136 is moved downward from the adsorption surface of the electrostatic chuck 114 and the lower end of the shaft 134 and the upper end of the projection 12c are separated from each other. Therefore, the elevating pin mechanism 130 and the electrostatic chuck 114 are not in an earth-fault state.

Subsequently, as illustrated in FIG. 8, the stage 110 is lowered to bring the shaft 134 and the projection 12c into contact with each other. Thus, the electrostatic chuck 114 (the seal band 114f, the dechucking portion 114g, and the contact portions 114h), the conductive member 120, the connecting member 138, the shaft 134, the projection 12c, and the process vessel 12 are electrically connected to each other. Therefore, the rear surface of the wafer W and the electrostatic chuck 114 are in the earth-fault state through the process vessel 12. As a result, the residual charges accumulated in the wafer W or the electrostatic chuck 114 is eliminated through the conductive member 120, the connecting member 138, the shaft 134, the projection 12c, and the process vessel 12.

Subsequently, as illustrated in FIG. 9, the stage 110 is further lowered to allow the upper end of the elevating pin 136 to be at the same height as the adsorption surface of the electrostatic chuck 114 or slightly protrude from the adsorption surface of the electrostatic chuck 114 so as to make contact with the rear surface of the wafer W. Thus, the residual charges accumulated in the wafer W is eliminated via the elevating pin 136, the shaft 134, the projection 12c, and the process vessel 12.

Subsequently, as illustrated in FIG. 10, the stage 110 is further lowered to allow the elevating pin 136 to further protrude from the adsorption surface of the electrostatic chuck 114 so as to support the rear surface of the wafer W and to separate the wafer W from the adsorption surface of the electrostatic chuck 114. At this time, since the residual charges accumulated in the wafer W and the electrostatic chuck 114 are eliminated, it is possible to suppress a deviation or damage of the wafer W.

As described above, in one embodiment of the present disclosure, the rear surface of the wafer W and the adsorption surface of the electrostatic chuck 114 are allowed to be in the earth-fault state before the wafer W is lifted up by the elevating pins 136. Thus, it is possible to eliminate the residual charges accumulated in the wafer W or the electrostatic chuck 114 before the wafer W is lifted up by the elevating pins 136. This makes it possible to suppress the deviation or damage of the wafer W when the wafer W is lifted up. Furthermore, since the residual charges accumulated in the wafer W or the electrostatic chuck 114 is eliminated by bringing the shaft 134 and the projection 12c into contact with each other so that the rear surface of the wafer W and the adsorption surface of the electrostatic chuck 114 are in the earth-fault state, there is no need to additionally install a circuit for charge elimination, a switch mechanism (circuit), or the like. That is to say, it is possible to eliminate the residual charges accumulated in the wafer W or the electrostatic chuck 114 with a simplified configuration.

Furthermore, in one embodiment of the present disclosure, when the wafer W is adsorbed onto the adsorption surface of the electrostatic chuck 114 by applying the voltage to the chuck electrodes 114a, the shaft 134 and the projection 12c are separated from each other. Thus, the electrostatic chuck 114 and the elevating pin mechanism 130 are in an electrically floating state without being in the earth-fault state. This makes it possible to prevent the electrostatic force of the electrostatic chuck 114 from being influenced.

Moreover, in one embodiment of the present disclosure, the dechucking portion 114g is formed to linearly extend from the center of the electrostatic chuck 114 to the outer edge thereof along the radial direction, and is connected to the seal band 114f at the outer edge. The dechucking portion 114g is installed on the adsorption surface of the electrostatic chuck 114. With this configuration, the residual charges accumulated near the center of the rear surface of wafer W is eliminated through the dechucking portion 114g. It is therefore possible to effectively eliminate charges existing on the entire rear surface of wafer W and also to effectively eliminate charges remaining on the surface of the electrostatic chuck 114.

Furthermore, in one embodiment of the present disclosure, in the case where the chuck electrode 114a is of a hyperbolic type having the pair of chuck electrodes 114a and 114a, the dechucking portion 114g is formed at a position which overlaps one chuck electrode 114a and does not overlap the other chuck electrode 114a in plan view. Thus, it is possible to suppress the installation of the dechucking portion 114g from influencing the electrostatic force of the electrostatic chuck 114.

Moreover, in one embodiment of the present disclosure, the pressing member 140 that presses the conductive member 120 against the contact portions 114h of the electrostatic chuck 114 is installed. With this configuration, it is possible to absorb a component tolerance and to provide a constant contact force.

According to the present disclosure in some embodiments, it is possible to suppress effectively a deviation or damage to a substrate due to residual charges, compared to a conventional technique.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A stage mechanism, comprising:
   an electrostatic chuck having a conductive film formed on a front surface thereof, the conductive film configured to make electrically contact with a rear surface of a substrate;
   a conductive member electrically connected to the conductive film and formed to extend to a rear surface of the electrostatic chuck;
   a moving member electrically connected to the conductive member via a connecting member and configured to move between a first position connected to a ground potential and a second position not connected to the ground potential; and
   a pressing member configured to press the conductive member against the conductive film.

2. The stage mechanism of claim 1, wherein the stage mechanism is installed inside a process vessel,
   the first position connected to the ground potential is a position at which the stage mechanism is electrically connected to the process vessel, and
   the second position not connected to the ground potential is a position at which the stage mechanism is electrically insulated from the process vessel.

3. The stage mechanism of claim 1, wherein the conductive film is formed on an adsorption surface of the electrostatic chuck so as to linearly extend from a center of the electrostatic chuck to an outer edge of the electrostatic chuck along a radial direction.

4. The stage mechanism of claim 1, wherein the electrostatic chuck is of a hyperbolic type having a pair of chuck electrodes, and
   the conductive film is formed at a position which overlaps one of the pair of chuck electrodes and does not overlap with the other chuck electrode in a plan view.

5. The stage mechanism of claim 1, further comprising: an elevating pin provided in the moving member and configured to make contact with the rear surface of the substrate, and
   the moving member is configured so that the elevating pin and the rear surface of the substrate are brought into contact with each other at the first position connected to the ground potential and the elevating pin and the rear surface of the substrate are separated from each other at the second position not connected to the ground potential.

6. The stage mechanism of claim 1, wherein the connecting member includes an elastic body.

7. The stage mechanism of claim 6, wherein the elastic body includes a coil spring.

8. A processing apparatus, comprising:
   a process vessel; and
   a stage mechanism installed in the process vessel and configured to mount a substrate thereon,
   wherein the stage mechanism comprises:
   an electrostatic chuck having a conductive film formed on a front surface thereof, the conductive film configured to make electrically contact with a rear surface of the substrate;
   a conductive member electrically connected to the conductive film and formed to extend to a rear surface of the electrostatic chuck;
   a moving member electrically connected to the conductive member via a connecting member and configured to move between a first position connected to a ground potential and a second position not connected to the ground potential; and
   a pressing member configured to press the conductive member against the conductive film.

9. The apparatus of claim 8, further comprising: a conductive projection provided at a bottom of the process vessel and configured to move upward and downward,
   the first position connected to the ground potential is a position at which the moving member and the conductive projection are brought into contact with each other, and
   the second position not connected to the ground potential is a position at which the moving member and the conductive projection are separated from each other.

10. The apparatus of claim 9, wherein the connecting member includes a first elastic body,
    the conductive projection configured to vertically move by an elastic deformation of a second elastic body, and
    a resilience force of the second elastic body is larger than that of the first elastic body.

11. A method of operating a stage mechanism,
    wherein the stage mechanism includes:
    an electrostatic chuck having a conductive film formed on a front surface thereof, the conductive film configured to make electrically contact with a rear surface of a substrate;
    a conductive member electrically connected to the conductive film and formed to extend to a rear surface of the electrostatic chuck;
    a moving member electrically connected to the conductive member via a connecting member and configured to move between a first position connected to a ground potential and a second position not connected to the ground potential;
    a pressing member configured to press the conductive member against the conductive film; and
    an elevating pin provided in the moving member and configured to make contact with the rear surface of the substrate,
    the method comprising:
    moving the moving member to the first position connected to the ground potential; and
    subsequently, bring the elevating pin into contact with the rear surface of the substrate.

* * * * *